(12) United States Patent
Kerr

(10) Patent No.: US 6,508,527 B1
(45) Date of Patent: Jan. 21, 2003

(54) METHOD FOR LAMINATING A PRE-PRESS PROOF TO SIMULATE PRINTING ON THIN PLASTIC

(75) Inventor: Roger S. Kerr, Brockport, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/863,597

(22) Filed: May 23, 2001

(51) Int. Cl.[7] .................................................. B41J 3/00
(52) U.S. Cl. .............................. 347/2; 156/277; 156/247
(58) Field of Search .............................. 347/2; 156/277, 156/247

(56) References Cited

U.S. PATENT DOCUMENTS

| | | | | |
|---|---|---|---|---|
| 4,027,345 A | * | 6/1977 | Fujisawa et al. ............. 101/470 |
| 4,202,663 A | * | 5/1980 | Haigh et al. ................. 101/464 |
| 4,366,223 A | * | 12/1982 | Larson ........................ 156/239 |
| 4,517,044 A | * | 5/1985 | Arnold ........................ 156/240 |
| 5,156,271 A | * | 10/1992 | Toner ......................... 156/227 |
| 5,203,942 A | | 4/1993 | DeCook et al. .............. 156/230 |
| 5,268,708 A | | 12/1993 | Harshbarger et al. ....... 346/134 |
| 5,337,132 A | * | 8/1994 | Cherian ....................... 156/277 |
| 5,363,179 A | * | 11/1994 | Cahill et al. ................. 156/277 |
| 5,478,434 A | | 12/1995 | Kerr et al. ................... 156/584 |
| 5,487,801 A | * | 1/1996 | Marion et al. ............... 156/247 |
| 5,488,455 A | * | 1/1996 | Cahill et al. ................. 156/277 |
| 5,688,581 A | * | 11/1997 | Chagnon et al. ............. 156/230 |
| 5,698,366 A | * | 12/1997 | Tutt et al. .................... 101/467 |
| 6,004,718 A | * | 12/1999 | Shinohara .................... 156/230 |
| 6,123,794 A | * | 9/2000 | Saff ............................. 156/230 |
| 6,277,229 B1 | * | 8/2001 | Popat et al. ................. 156/230 |
| 6,299,301 B1 | * | 10/2001 | Baek et al. .................. 156/277 |

* cited by examiner

Primary Examiner—John Barlow
Assistant Examiner—Leonard Liang
(74) Attorney, Agent, or Firm—Buskop Law Group

(57) ABSTRACT

A method for laminating a proof to simulate printing on thin plastic materials consisting of the steps of: creating a first support layer (150); creating an imaged receiver sheet (140) comprising an image (210), a first thermal print layer (220), and the first support layer (150); forming a second support layer (170) comprising a support base, a aluminized layer (200) and a release layer; creating an imageless receiver sheet (280) comprising a second thermal print layer (225), and the second support layer (170); laminating the imageless receiver sheet (280) to the imaged receiver sheet (140) thereby encapsulating the image (210) between the first thermal print layer (220) and second thermal print layer (225); removing the first support layer (150); removing the second support layer (170); forming an encapsulated image (250) simulating a proof.

13 Claims, 4 Drawing Sheets

METHOD FOR LAMINATING A PRE-PRESS PROOF TO SIMULATE PRINTING ON THIN PLASTIC

FIELD OF THE INVENTION

The present invention relates to a method of color proofing, and in particular, to a method of preparing images using a method which creates pre-press proof to simulate the printed image, and more specifically to creating a pre-press proof simulating printing on thin plastic.

BACKGROUND OF THE INVENTION

Pre-press proofing is a procedure that is used primarily by the printing industry for creating representative images of printed material. In the printing industry, pre-press color proofs are used to check for color balance, control parameters and other important image quality requirements, without the cost and time that is required to actually produce printing plates, set up a printing press and produce an example of an representative image, which would result in higher costs and a loss of profits that would ultimately be passed on to the customer.

To create a pre-press proof, first an original image is separated into individual color separations or digital files. The original image is scanned and separated into the three subtractive primaries and black. Typically, a color scanner is used to create the color separations or digital files and in some instances more than four, color separations or digital files are used. Although there are several ways used in the printing industry to create a pre-press proof from the color separations or digital files they are generally one of three types. The first method is a color overlay system that employs the representative image on a separate base for each color, then the image is overlaid on each other to create a pre-press proof. The second method is a single integral sheet process in which the separate colors for the representative image are transferred one at a time by lamination onto a single base. The third is a digital method in which the representative image is produced directly onto a receiver stock, or onto an intermediate sheet and then transferred by lamination onto a receiver stock from digital files.

The representative image to be laminated can be, but is not limited to being created on a commercially available Kodak image processing apparatus, depicted in commonly assigned U.S. Pat. No. 5,268,708, which describes an image processing apparatus having half-tone color imaging capabilities. The above-mentioned image processing apparatus is arranged to form a representative image onto a sheet of thermal print media. In that process, dye from a sheet of dye donor material is transferred to the thermal print media, by applying a sufficient amount of thermal energy to the dye donor sheet material to form the representative image. The image processing apparatus is comprised generally of a material supply assembly consisting of a lathe bed scanning subsystem. The scanning subsystem includes: a lathe bed scanning frame, translation drive, translation stage member, printhead, imaging drum, and media exit transports.

The operation of the image processing apparatus comprises: metering a length of the thermal print media (in roll form) from the material supply assembly. The thermal print media is then measured and cut into sheet form of the required length and transported to the imaging drum, registered, wrapped around and secured onto the imaging drum. Next, a length of dye donor material (in roll form) is also metered out of the material supply assembly, then measured and cut into sheet form of the required length. It is then transported to the imaging drum and wrapped around the imaging drum utilizing a load roller which is described in detail, in commonly assigned U.S. Pat. No. 5,268,708, such that it is superposed in the desired registration with respect to the thermal print media (which has already been secured to the imaging drum).

After the dye donor sheet material is secured to the periphery of the imaging drum, the scanning subsystem or write engine provides the imaging function. This imaging function is accomplished by retaining the thermal print media and the dye donor sheet material on the imaging drum while it is rotated past the printhead. The translation drive traverses the printhead and translation stage member axially along the axis of the imaging drum, in coordinated motion with the rotating imaging drum. These movements combine to produce the representative image on the thermal print media.

Once a representative image has been formed on the thermal print media, the dye donor sheet material is then removed from the imaging drum. This is accomplished without disturbing the thermal print media that is beneath it. The dye donor sheet material is then transported out of the image processing apparatus by means of the material exit transport. Additional dye donor sheet materials are sequentially superimposed with the thermal print media on the imaging drum. These materials are then imaged onto the thermal print media as previously mentioned, until the representative image is on the thermal print media. The completed representative image formed thereon is then unloaded from the imaging drum and transported by the receiver sheet material exit transport to an exit tray in the exterior of the image processing apparatus.

After a representative image has been formed on the thermal print media as previously described, it is then transferred to the receiver stock such that the pre-press proof is representative of an image would be printed on a printing press. A Kodak Laminator as described in U.S. Pat. No. 5,478,434 can be used to bond or laminate the representative image as a part of a color proofing system, but this invention is not limited to the use of this device. U.S. Pat. No. 5,203,942 describes a Kodak Laminator that employs a lamination/de-lamination system as applied to a drum laminator and pending U.S. patent application Ser. No. 09/676,877 describes a Kodak Laminator that employs endless belts incorporated into the lamination apparatus. For the purpose of this patent application the laminator described in pending U.S. patent application Ser. No. 09/676,877 will be used. It should be noted that the present invention described in this disclosure is not limited to a Kodak Laminator or type of laminator referenced above.

Generally laminating a pre-press proof is a two-pass process. For the first step, a sheet of pre-laminate, which has a pre-laminate support layer and an encapsulation or protective layer, is placed on top of a receiver sheet, which is also called "receiver stock" in the industry. This construction of multiple layers is a lamination sandwich, which is feed into the laminator. Once the lamination sandwich exits the laminator the pre-laminate support layer is peeled away from he now pre-laminated receiver stock.

For the second pass, the imaged thermal print media with the representative image formed thereon is placed on the pre-laminated receiver stock with representative image face down on the pre-laminated receiver stock and fed into the laminator. After the lamination sandwich has exited the laminator the thermal print support layer is peeled away, leaving the completed pre-press proof simulating an image produced on a printing press.

The above-described lamination method works well for laser, thermal, and ink jet pre-press proofs on most materials. However, on thin plastics, it is very difficult and sometimes not possible, to laminate an image. Subsequently, there exists a need to simulate an image on thin plastic materials, such as a bread wrapper.

SUMMARY OF THE INVENTION

An object of the present invention is to provide a method for laminating a pre-press proof to simulate printing on thin plastic.

One method of the invention involves laminating a pre-press proof to simulate printing on thin plastic materials consisting of the steps of: creating an imaged receiver sheet comprising: an image, a first thermal print layer, and a first support layer; having a first support base, a first aluminized layer, and a first release layer; laminating an imageless receiver sheet comprising a second thermal print layer, and said second support layer having; a second support base, a second aluminized layer and a second release layer; to the imaged receiver sheet thereby encapsulating the image between the first thermal print layer and second thermal print layer; removing the first support layer; removing the second support layer, and forming an encapsulated image simulating a pre-press proof on thin plastic.

Another method of the invention involves laminating a pre-press proof to simulate printing on thin plastic materials consisting of the steps of: creating an imaged receiver sheet comprising: an image, a thermal print layer, and said first support layer; having a first support base, a aluminized layer, and a first release layer; laminating an imageless plastic receiver sheet comprising; a plastic receiver sheet and the second support layer, having; a second support base and a second release layer to the imaged receiver sheet thereby encapsulating the image between the thermal print layer and the plastic receiver sheet; removing the first support layer; removing the second support layer; forming an encapsulated image simulating a pre-press proof on thin plastic.

The invention, and its objects and advantages, will become more apparent, in the detailed description of the preferred embodiments presented below.

DETAILED DESCRIPTION OF THE INVENTION

The present description will be directed, in particular, to elements forming part of, or cooperating more directly, with an apparatus in accordance with the present invention. It is to be understood that elements not specifically shown or described may take various forms well known to those skilled in the art. For the sake of discussion, but not limitation, the preferred embodiment of the present invention will be illustrated in relation to a laminating apparatus for making pre-press proof, simulating printing on thin plastic materials.

Figure 1:
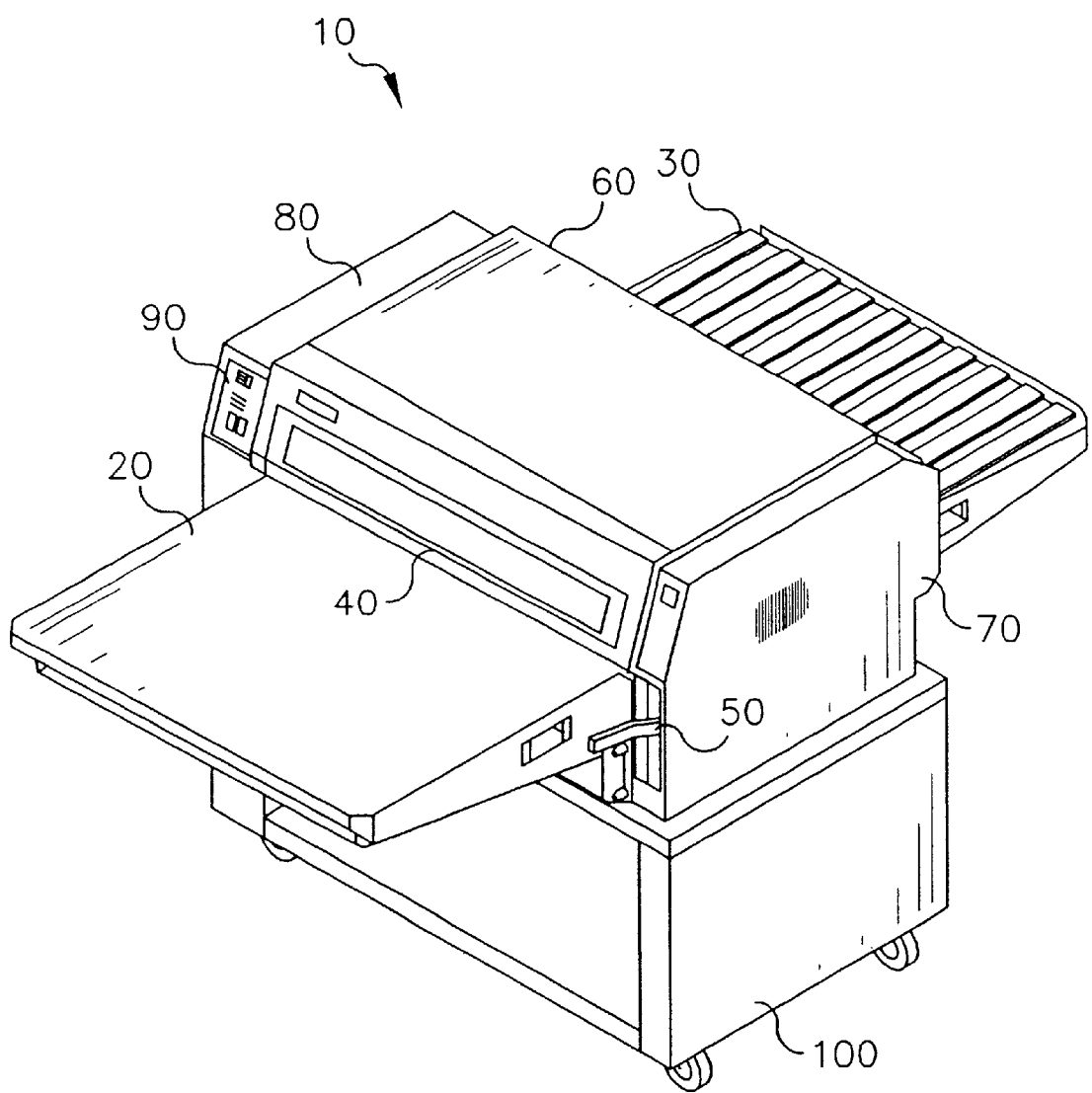
FIG. 1 is a perspective view showing a laminator known in the related art used with the present invention.

Referring to the drawings wherein like reference numerals represent identical or corresponding parts throughout the several views. Referring to FIG. 1, there is shown perspective view of laminator 10 as described in U.S. patent application Ser. No. 09/676,877. The laminator has an entrance table 20, exit table 30, entrance slot 40, pressure lever 50, top cover 60, right side cover 70, left side cover 80, control panel 90, and lamination base 100.

Figure 2:
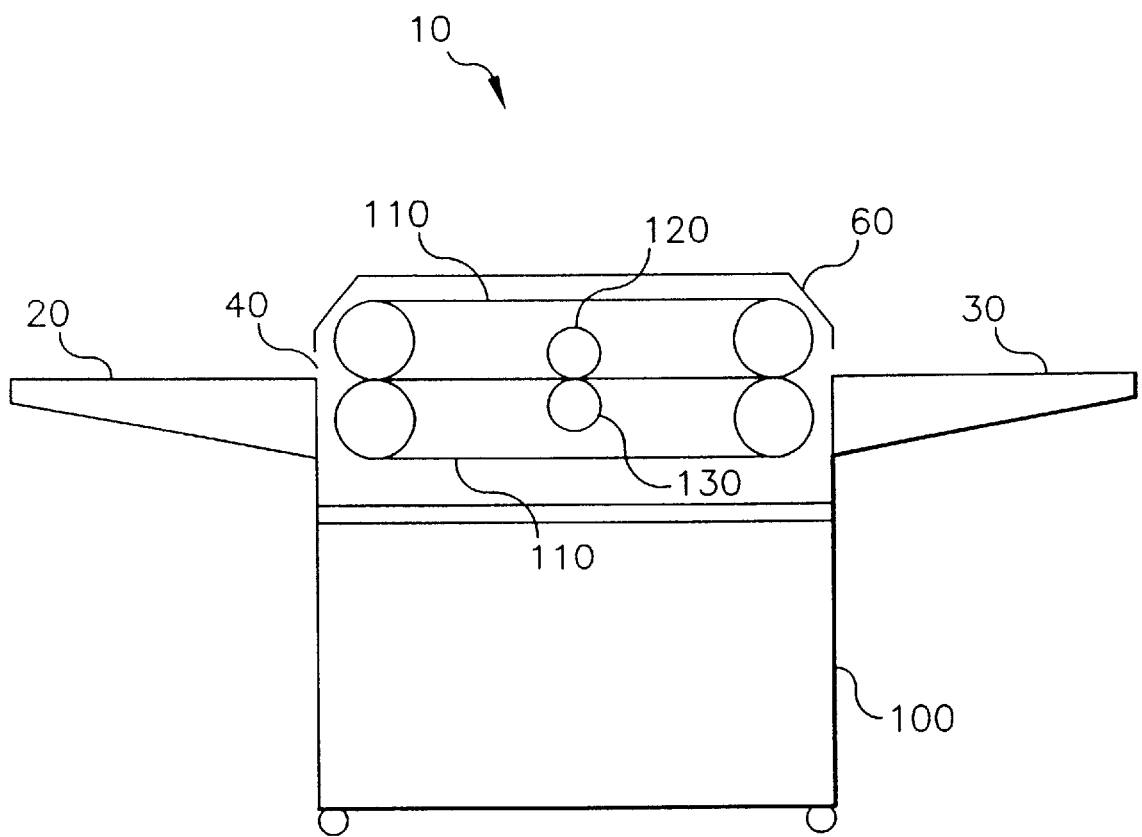
FIG. 2 is a schematic right side elevation of the laminator of FIG. 1.

FIG. 2 is a schematic right side elevation of the laminator of FIG. 1 showing endless belts 110 with upper lamination roller 120 and lower lamination roller 130 which convey the media to be laminated through the laminator 10. Media to be bonded or laminated passes between the endless belts 110. Upper lamination roller 120 and lower lamination roller 130 provide heat and pressure to laminate the desired media together. This configuration with upper lamination roller 120 and lower lamination roller 130 known in the art as a "straight-through" laminator. Although the illustrated embodiments show both the upper lamination roller 120 and lower lamination roller 130 as heated pressure rollers, it also should be recognized that only one of the upper lamination roller 120 and lower lamination roller 130 maybe heated. It is further recognized that both upper lamination roller 120 and lower lamination roller 130 do not have to be heated for cold lamination applications.

The following methods are usable for simulating a pre-press proof on thin plastic material with a resolution of between about 1400 and about 4000 dpi, although in the most preferred embodiment, the high resolution is between 1800 and 3000 dpi.

The image can be initially created on thermal print media with an ink jet printer, laser printer, or any other printing method known in the art.

Figure 3:
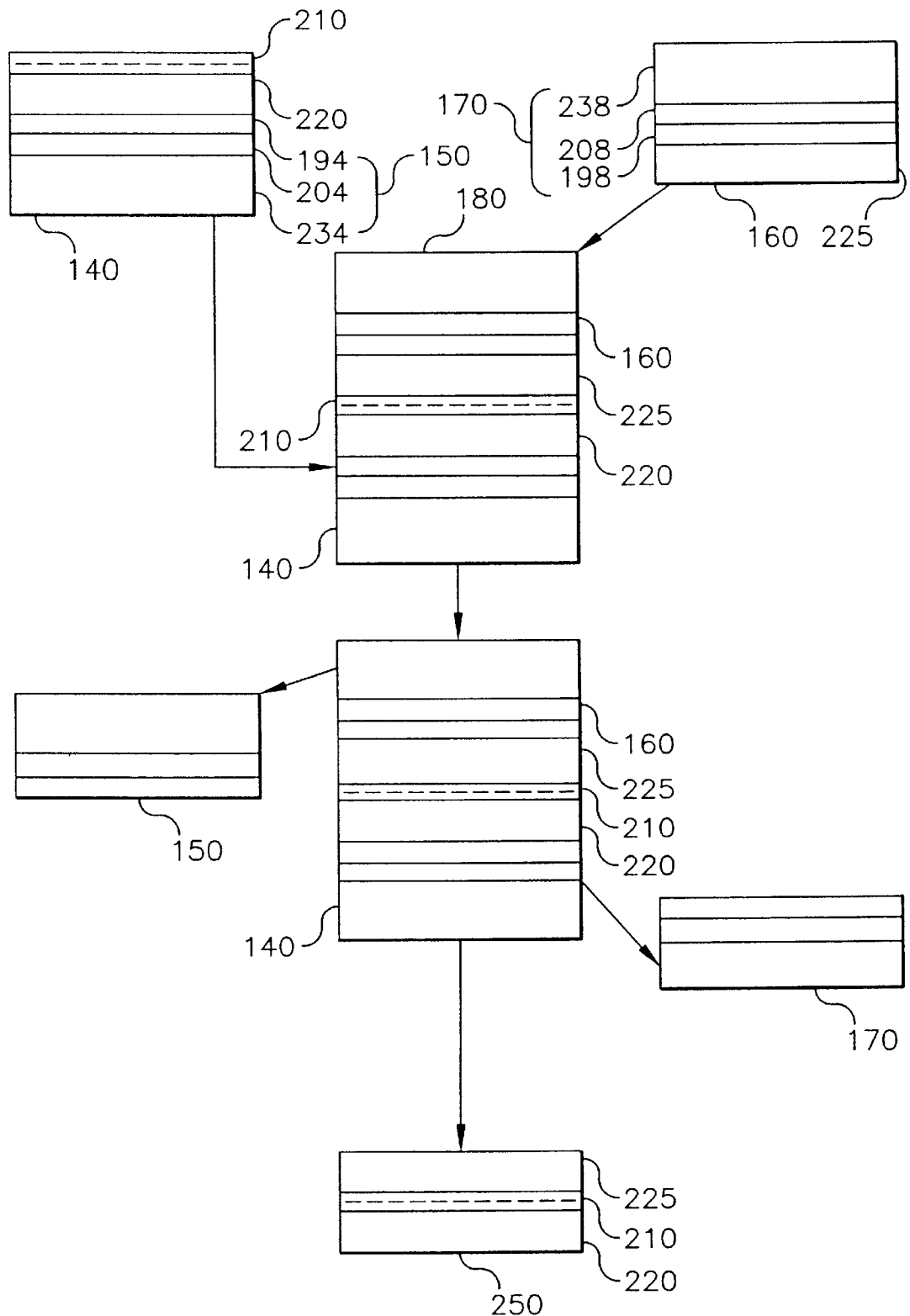
FIG. 3 is a block diagram showing an embodiment of the method for producing a pre-press proof to simulate printing on thin plastic material of the present invention.

Referring to FIG. 3 a block diagram is shown outlining a method for laminating an encapsulated image 250 to simulate printing on thin plastic. This method consists of the steps of: creating an imaged receiver sheet 140 having an image 210, first thermal print layer 220 and a first support layer 150 wherein the first support layer 150 comprises a first support base 234, a first aluminized layer 204 and a first release layer 194. It should be noted that the first support layer 150 may be comprised of several layers or just a support base. Next, an imageless receiver sheet 160 having a second thermal print layer 225 and a second support layer 170 wherein the second support layer 170 comprises a second support base 238, a second aluminized layer 208 and a second release layer 198. It should be noted that the second support layer 170 may be comprised of several layers or just a support base. The imageless second receiver sheet 160 is then laminated to the imaged receiver sheet 140 thereby encapsulating the image 210 between the first thermal print layer 220 and the second thermal print layer 225. The first support layer 150 and the second support layer 170 are then removed from the resultant lamination sandwich 180, forming an encapsulated image 250 simulating a pre-press proof on thin plastic material. The first thermal print layer 220 and second thermal print layer 225 have a thickness ranging from 1 to 75microns, however, 1 to 25 microns is the preferred thickness.

Figure 4:
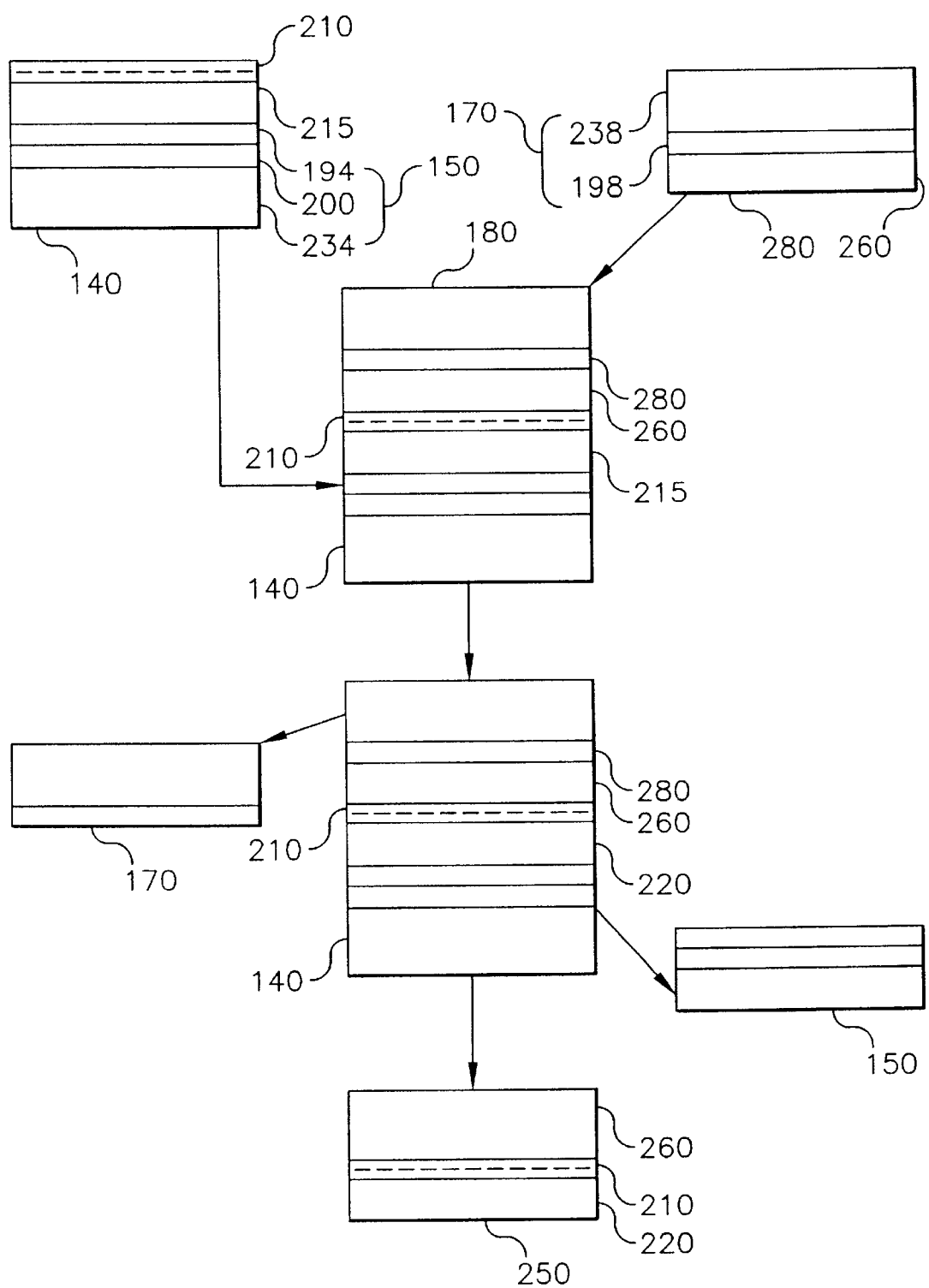
FIG. 4 is a block diagram showing another embodiment of the method for producing a pre-press proof to simulate printing on thin plastic material of the present invention.

Referring to FIG. 4 a block diagram is shown outlining another method for laminating an encapsulated image 250 consisting of the steps of: creating an imaged receiver sheet 140 having an image 210, a thermal print layer 215 and a first support layer 150, wherein the first support layer 150 comprises a first support base 234, an aluminized layer 200 and a first release layer 194. It should be noted that the support layer 150 may be comprised of several layers or just a support base. Next, an imageless plastic receiver sheet 280 comprised of; a plastic receiver sheet 260, and a second support layer 170. The second support layer preferably comprises a second support base 238 and second release layer 198. It should be noted that the second support layer 170 may be comprised of several layers or just a single base. The imageless plastic receiver sheet 280 is then laminated to the imaged receiver sheet 140 thereby encapsulating the image 210 between the thermal print layer 215 and the plastic receiver sheet 260. The first support layer 150 and the second support layer 170 are then removed from the resultant lamination sandwich 180, forming an encapsulated image 250 simulating a pre-press proof on thin plastic material. The support layer can be made from polyester or polyethylene or any crystalline polymer could be used.

In the embodiments of the present invention, the method for laminating is also for forming encapsulated image 250 with a resolution of between about 1400 and about 4000 dpi.

In one embodiment of the present invention, the method for laminating involves using a plastic receiver sheet 260 to encapsulate one side of the image 210. The plastic receiver sheet 260 can be made from polyester but polyethylene or any crystalline polymer could be used. It is also contemplated that the plastic receiver sheet 260 material preferably is clear, but any color to simulate the printed material can be used. The plastic receiver sheet 260 also has a thickness ranging from 1 to 75 microns, however, 1 to 25 microns is the preferred thickness.

In the embodiments of the present invention, the thermal print layer 215, first thermal print layer 220 and the second thermal print layer 225 used to encapsulate image 210 comprises Butvar as the preferred material. The thickness of the Butvar can be modified for each use of the novel method to improve the feel of the encapsulated image 250. The image may have identical thicknesses of Butvar or disparate thicknesses of Butvar, when the image is encapsulated on two sides. Polyvinyl butryl is the generic term for Butvar®.

Alternative encapsulating materials can be polyacrylates or other plastic materials well known in the art.

For the lamination process of this invention, the most preferred lamination temperatures of this process are about 130° C. but lower or higher pressures can be used.

In this invention, the preferred pressure for lamination is about 80 psi, but lower or higher pressures can be used.

This lamination process contemplates both hot and cold lamination. This lamination process works for ink jet, as well as high resolution images, preferably having a resolution of between 1400 and 4000 dpi and more preferably between about 1800 and 3000 dpi.

The invention has been described in detail with particular reference to certain preferred embodiments thereof, but it will be understood that variations and modifications can be effected within the scope of the invention.

10. Laminator
20. Entrance table
30. Exit table
40. Entrance slot
50. Pressure lever
60. Top cover
70. Right side cover
80. Left side cover
90. Control panel
100. Lamination base
110. Endless belts
120. Upper lamination roller
130. Lower lamination roller
140. Imaged receiver sheet
150. First support layer
160. Imageless second receiver sheet
170. Second support layer
180. Lamination sandwich
194. First release layer
198. Second release layer
200. Aluminized layer
204. First aluminized layer
208. Second aluminized layer
210. Image
215. Thermal print layer
220. First thermal print layer
225. Second thermal print layer
234. Support base
238. Support base
250. Encapsulated image
260. Plastic receiver sheet
280. Imageless plastic receiver sheet

What is claimed is:

1. A method for laminating a proof to simulate printing on thin plastic materials consisting of the steps of:
   a) creating an imaged receiver sheet comprising: an image with high resolution between about 1400 and about 4000 dpi, a first thermal print layer with thickness ranging from 1 micron to 75 microns, and a first support layer;
   b) forming a second support layer with thickness ranging from 1 micron to 75 microns comprising a second support base, a second aluminized layer, and a second release layer;
   c) creating an imageless plastic receiver sheet comprising a plastic sheet and said second support layer;
   d) laminating the imageless plastic receiver sheet with said imaged receiver sheet thereby encapsulating said image between the thermal print layer and the plastic sheet;
   e) removing said first support layer;
   f) removing said second support layer;
   g) forming an encapsulated image simulating a proof; and wherein said first thermal print layer and said second thermal print layer has a thickness different from the thickness of the plastic sheet.

2. The method of claim 1 wherein said plastic receiver sheet is clear.

3. The method of claim 1 wherein said first thermal print layer and said second thermal print layers have a thickness ranging from 1 to 25 microns.

4. The method of claim 1 wherein said imaged receiver sheet has a resolution of between about 1800 and 3000 dpi.

5. The method of claim 1 wherein the plastic sheet is a member of the group comprising: polyester, polyethylene.

6. The method of claim 1 wherein said first thermal print layer and said second thermal print layer comprises a polyvinyl butryl.

7. The method of claim 1 wherein said thermal print layer is a polyacrylate.

8. The method of claim 1 wherein said laminating step is performed at about 120° C. using dye based images.

9. The method of claim 1 wherein said laminating step uses cold lamination and pigment based images.

10. The method of claim 1 wherein said laminating step uses pressures up to 80 psi.

11. The method of claim 1 wherein said images are produced by ink jet printing.

12. The method of claim 1 wherein said first support layer comprises a first support base and a first release layer.

13. The method of claim 1 wherein said first support layer is comprised of a first support base, a first release layer and a first aluminized layer.

* * * * *